(12) United States Patent
Boss et al.

(10) Patent No.: US 10,784,421 B2
(45) Date of Patent: Sep. 22, 2020

(54) METHOD OF PRODUCING AN OPTOELECTRONIC COMPONENT

(71) Applicant: OSRAM OLED GmbH, Regensburg (DE)

(72) Inventors: Markus Boss, Regensburg (DE); Tobias Gebuhr, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/326,731

(22) PCT Filed: Aug. 23, 2017

(86) PCT No.: PCT/EP2017/071206
§ 371 (c)(1),
(2) Date: Feb. 20, 2019

(87) PCT Pub. No.: WO2018/037033
PCT Pub. Date: Mar. 1, 2018

(65) Prior Publication Data
US 2019/0181310 A1  Jun. 13, 2019

(30) Foreign Application Priority Data
Aug. 23, 2016 (DE) .................. 10 2016 115 629

(51) Int. Cl.
*H01L 33/56* (2010.01)
*H01L 21/56* (2006.01)
(Continued)

(52) U.S. Cl.
CPC .......... *H01L 33/56* (2013.01); *H01L 21/565* (2013.01); *H01L 25/0753* (2013.01);
(Continued)

(58) Field of Classification Search
CPC ... H01L 21/561; H01L 21/565; H01L 21/568; H01L 25/0753; H01L 2933/005; H01L 33/0095; H01L 33/54; H01L 33/56
(Continued)

(56) References Cited

U.S. PATENT DOCUMENTS

| | | | | |
|---|---|---|---|---|
| 5,353,498 A | * | 10/1994 | Fillion | H01L 25/0657 29/840 |
| 2008/0135977 A1 | * | 6/2008 | Meyer | H01L 23/645 257/531 |

(Continued)

FOREIGN PATENT DOCUMENTS

| | | |
|---|---|---|
| DE | 10 2010 054068 A1 | 6/2012 |
| WO | 2015/036887 | 3/2015 |

*Primary Examiner* — Duy T Nguyen
(74) *Attorney, Agent, or Firm* — DLA Piper LLP (US)

(57) ABSTRACT

A method of producing an optoelectronic component includes providing a carrier having an upper side; providing a mat configured as a fiber-matrix semifinished product and having a through-opening; arranging an optoelectronic semiconductor chip over the upper side of the carrier; arranging the mat over the upper side of the carrier such that the optoelectronic semiconductor chip is arranged in the opening of the mat; and compacting the mat to form a composite body including the mat and the optoelectronic semiconductor chip.

14 Claims, 4 Drawing Sheets

(51) Int. Cl.
   *H01L 33/54*      (2010.01)
   *H01L 25/075*     (2006.01)
   *H01L 33/00*      (2010.01)

(52) U.S. Cl.
   CPC ............ *H01L 33/54* (2013.01); *H01L 21/561* (2013.01); *H01L 21/568* (2013.01); *H01L 33/0095* (2013.01); *H01L 2933/005* (2013.01)

(58) Field of Classification Search
   USPC .......................................................... 438/28
   See application file for complete search history.

(56) References Cited

U.S. PATENT DOCUMENTS

| | | | |
|---|---|---|---|
| 2010/0157568 A1 | 6/2010 | Ewe et al. | |
| 2011/0291293 A1 | 12/2011 | Tuominen et al. | |
| 2014/0151623 A1* | 6/2014 | Jeon | H01L 45/04 257/2 |
| 2016/0001532 A1* | 1/2016 | Maziers | B29C 41/04 428/318.6 |

\* cited by examiner

METHOD OF PRODUCING AN OPTOELECTRONIC COMPONENT

TECHNICAL FIELD

This disclosure relates to a method of producing an optoelectronic component.

BACKGROUND

Various housing designs for optoelectronic components are known. Optoelectronic components are known having housings whose dimensions are only slightly larger than the dimensions of optoelectronic semiconductor chips, arranged in the housings of the optoelectronic components. Such housings are also known as chip-size packages (CSP). It is known to produce such housings by molding around an optoelectronic semiconductor chip with a molding material by a molding method.

SUMMARY

We provide a method of producing an optoelectronic component including providing a carrier having an upper side; providing a mat configured as a fiber-matrix semifinished product and having a through-opening; arranging an optoelectronic semiconductor chip over the upper side of the carrier; arranging the mat over the upper side of the carrier such that the optoelectronic semiconductor chip is arranged in the opening of the mat; and compacting the mat to form a composite body including the mat and the optoelectronic semiconductor chip.

LIST OF REFERENCES 10 optoelectronic component
100 mat
101 upper side
102 lower side
110 opening
111 edge of the opening
200 carrier
201 upper side
300 optoelectronic semiconductor chip
301 upper side
302 lower side
310 circumferential gap
320 width
400 compacting apparatus
410 chamber
500 composite body
501 upper side
502 lower side
510 separating plane

DETAILED DESCRIPTION

Our method of producing an optoelectronic component comprises steps of providing a carrier having an upper side, providing a mat configured as a fiber-matrix semifinished product and has a through-opening, arranging an optoelectronic semiconductor chip over the upper side of the carrier, arranging the mat over the upper side of the carrier such that the optoelectronic semiconductor chip is arranged in the opening of the mat, and compacting the mat, a composite body comprising the mat to thereby form the optoelectronic semiconductor chip.

This method allows a simple and economical production of an optoelectronic component having a housing whose dimensions are not substantially greater than the dimensions of the optoelectronic semiconductor chip. In this example, the composite body formed from the mat and the optoelectronic semiconductor chip forms a housing of the optoelectronic component that can be obtained by the method.

Since in this method the optoelectronic semiconductor chip is already surrounded by the material of the mat before formation of the composite body, because the mat and the optoelectronic semiconductor chip are arranged over the upper side of the carrier such that the optoelectronic semiconductor chip is arranged in the opening of the mat, the material enclosing the optoelectronic semiconductor chip in the composite body does not have to flow around the optoelectronic semiconductor chip in this method, or has to flow around it only to a small extent. This makes it possible to select the material of the mat configured as a fiber-matrix semifinished product without concern for its flow properties. This makes it possible to control the material in respect of other parameters. In particular, the method makes it possible to select the material of the mat configured as a fiber-matrix semifinished product such that the mat and the composite body comprising the mat and the optoelectronic semiconductor chip have a desired thermal expansion coefficient. In particular, the method makes it possible to adapt the thermal expansion coefficients of the mat and the composite body to a thermal expansion coefficient of the carrier used during the method. The effect achievable in this way is that when carrying out the method, even under the influence of temperature changes, only minor stresses occur between the composite body formed by the method and the carrier used during the method. In this way, the risk of crack formation or other mechanical damage to the composite body formed during the method is advantageously reduced.

Another advantage of the method is that compacting the mat can be carried out at a low pressure compared to a molding method. This allows gentle treatment of the optoelectronic semiconductor chip and of the carrier. This also reduces the risk of damage to the optoelectronic component obtained by the method.

The method may comprise a further step of separating the composite body from the carrier. In this example, the carrier may be a temporary carrier used only while carrying out the method. This may optionally make it possible to reuse the carrier subsequently to produce further optoelectronic components.

The mat may be provided having a multiplicity of through-openings. A multiplicity of optoelectronic semiconductor chips are arranged over the upper side of the carrier. The mat is then arranged over the upper side of the carrier such that an optoelectronic semiconductor chip is respectively arranged in each opening of the mat. The method in this example comprises a further step of dividing the composite body. In this example, the method allows simultaneous production of a multiplicity of optoelectronic components in common processing steps. The individual optoelectronic components are not individualized by dividing the composite body until after the common processing steps have been carried out. By the parallel production of a plurality of optoelectronic components, which is made possible in this way, the time required for production per optoelectronic component is advantageously reduced. Furthermore, the production costs per optoelectronic component are advantageously reduced.

The opening of the mat may be dimensioned such that, after the mat has been arranged over the upper side of the carrier, a circumferential gap remains between the optoelectronic semiconductor chip and the edge of the opening, which gap has a width of 50 μm to 400 μm, in particular a width of 100 μm to 200 μm. This means that the opening of the mat is larger than the optoelectronic semiconductor chip. This advantageously makes it easier to arrange the mat over the upper side of the carrier such that the optoelectronic semiconductor chip is arranged in the opening of the mat. The gap located between the optoelectronic semiconductor chip and the edge of the opening is in this method advantageously closed during compacting of the mat so that the optoelectronic semiconductor chip is firmly enclosed by the material of the mat in the composite body formed from the mat and the optoelectronic semiconductor chip. To this end, we found it advantageous to configure the gap with the width specified.

The mat may be provided, and arranged over the upper side of the carrier such that an upper side, facing away from the carrier, of the mat is raised above an upper side, facing away from the carrier, of the optoelectronic semiconductor chip. This advantageously makes it possible to compact the mat while carrying out the method without damaging the optoelectronic semiconductor chip.

The upper side of the mat and the upper side of the optoelectronic semiconductor chip may be flush after compacting the mat. By the shape change of the mat associated with compacting the mat, a possible gap between the optoelectronic semiconductor chip and the edge of the opening of the mat can be closed. Because the upper side of the mat and the upper side of the optoelectronic semiconductor chip are flush after compacting the mat, the composite body formed by the method advantageously comprises a substantially planar upper side.

Compacting the mat may be carried out by a vacuum bag method, in an autoclave or by compression molding. Advantageously, these methods allow simple and economical compacting of the mat, which is gentle on the optoelectronic semiconductor chip.

The mat may comprise fibers present as a quasi-isotropic fabric. Advantageously, the mat may therefore have isotropic properties, in particular an isotropic thermal expansion coefficient.

The mat may comprise fibers present as a unidirectional fabric. In this way, the mat may advantageously have anisotropic properties, in particular an anisotropic thermal expansion coefficient. In this example, the thermal expansion coefficient of the mat in the fiber direction may differ from the thermal expansion coefficient of the mat transversely to the fiber direction.

The mat may comprise glass fibers, in particular glass fibers comprising E-glass. Advantageously, the glass fibers of the mat may in this example have isotropic thermal expansion coefficients, in particular the same thermal expansion coefficients in the fiber direction and transversely to the fiber direction.

The mat may comprise aramid fibers. Advantageously, these aramid fibers may have a thermal expansion coefficient whose value in the fiber direction differs from the value transversely to the fiber direction.

The mat may have after compacting a fiber volume content of 30% to 70%, in particular a fiber volume content of 40% to 60%, in particular a fiber volume content of 45% to 55%. Advantageously, such a fiber volume content of the mat makes it possible to adapt, in particular match, a thermal expansion coefficient of the mat to a thermal expansion coefficient of the carrier used in the method.

The mat may comprise an epoxy resin. This advantageously makes it possible to cure the mat during compacting of the mat. In this way, the composite body formed by the method can have a high mechanical strength.

Provision of the mat may comprise formation of the opening by a stamping method or a cutting method, in particular by a laser cutting method. Advantageously, this allows a simple and economical formation of the opening in the mat. The shape and size of the opening may in this example be established with high accuracy.

The carrier may be provided as a circuit board, a ceramic carrier or a metal carrier. Advantageously, a thermal expansion coefficient of the mat may in this method be adapted to a thermal expansion coefficient of the carrier so that only minor stresses are created while carrying out the method, with the result that only a minor mechanical stress is exerted on the composite body formed during the method.

The carrier may have a first thermal expansion coefficient. The material of the mat may have a second thermal expansion coefficient after compacting. In this example, the first thermal expansion coefficient and the second thermal expansion coefficient differ by no more than 20%, in particular by no more than 10%. Advantageously, in this example only minor thermal stresses occur between the carrier and the composite body formed by the method while carrying out the method. A risk of damage to the composite body is thereby advantageously reduced.

The above-described properties, features and advantages, as well as the way in which they are achieved, will become more clearly and readily comprehensible in conjunction with the following description of examples, which will be explained in more detail in connection with the drawings.

Figure 1:
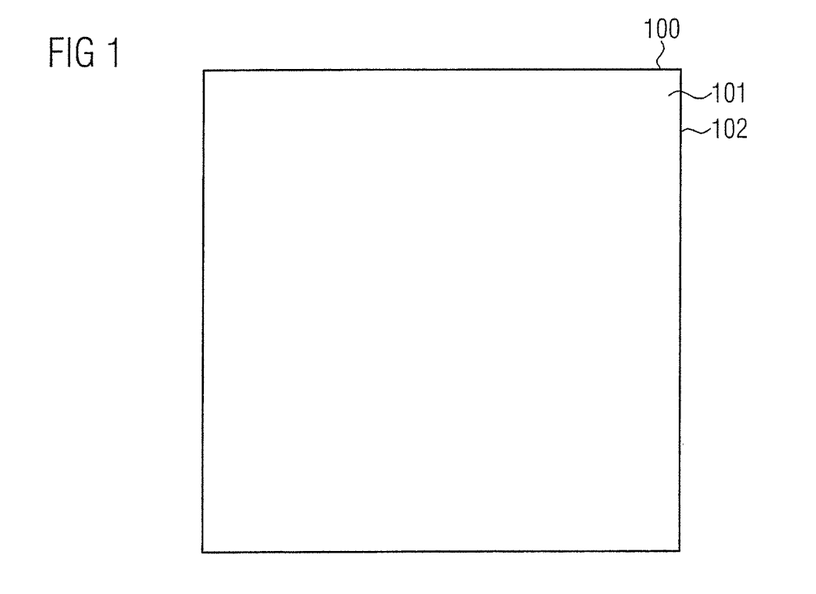
FIG. 1 schematically shows a plan view of an upper side of a mat configured as a fiber-matrix semifinished product.

FIG. 1 shows a schematic representation of a plan view of a mat 100 configured as a fiber-matrix semifinished product. The mat 100 has a flat, two-dimensional shape with an upper side 101 visible in FIG. 1 and a lower side 102 lying opposite the upper side 101. In the schematic representation of FIG. 1, the mat 100 has a rectangular shape. The mat 100 can, however, also have a different shape.

The mat 100 configured as a fiber-matrix semifinished product comprises fibers impregnated with a polymer matrix. The fibers may, for example, be endless fibers. In this example, the mat 100 is configured as a prepreg.

The fibers of the mat 100 may, for example, be present as a quasi-isotropic fabric or as a unidirectional fabric. The fibers of the mat 100 may, for example, be configured as glass fibers, in particular, for example, as glass fibers comprising E-glass. The fibers of the mat 100 may, however, for example, also be configured as aramid fibers (Kevlar fibers). The polymer matrix of the mat 100 may, for example, comprise an epoxy resin.

Figure 2:
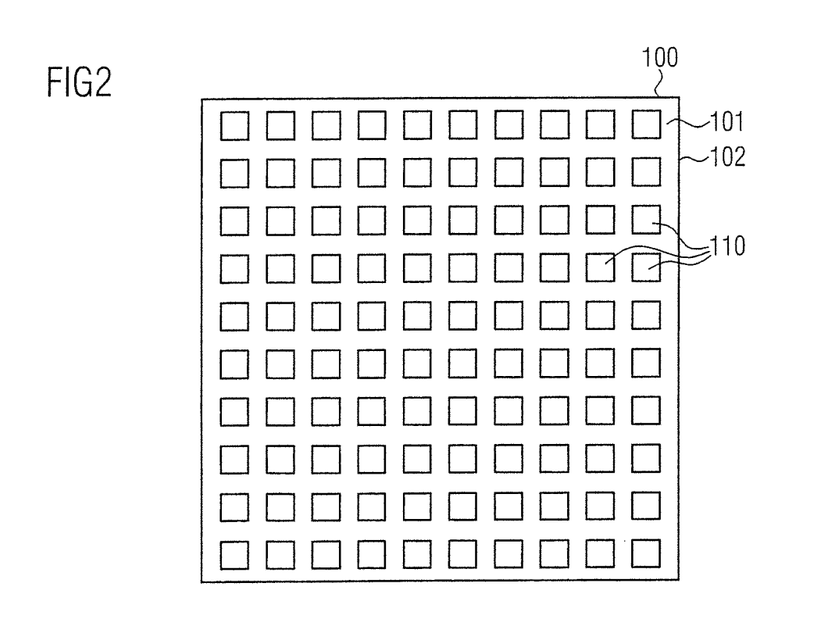
FIG. 2 schematically shows a view of the mat with openings formed therein.

FIG. 2 shows a schematic representation of a plan view of the upper side 101 of the mat 100 in a processing state chronologically following the representation of FIG. 1.

A multiplicity of openings 110 have been formed in the mat 100. The openings 110 respectively extend through the mat 100, between the upper side 101 and the lower side 102 of the mat 100. The openings 110 are arranged in a regular matrix arrangement, although this is not necessarily required. In the example represented, the openings 110 have square cross sections. It is, however, likewise possible to form the openings 110 with non-square cross sections, for example, with rectangular cross sections or with circular disk-shaped cross sections.

The openings 110 may, for example, have been formed in the mat 100 by a stamping method or a cutting method. In particular, the openings 110 may, for example, have been formed in the mat 100 by laser cutting.

Figure 3:
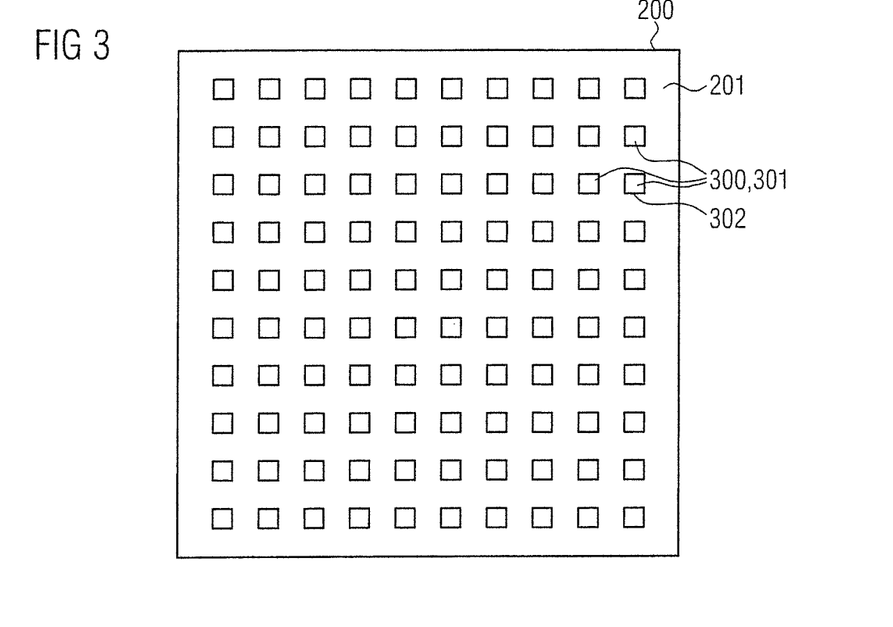
FIG. 3 schematically shows a plan view of optoelectronic semiconductor chips arranged over an upper side of a carrier.

FIG. 3 shows a schematic representation of a plan view of an upper side 201 of a carrier 200. The upper side 201 of the carrier 200 is configured to be essentially planar. In the example shown in FIG. 3, the carrier 200 has a rectangular shape. The carrier 200 could, however, also have a circular disk shape or a different shape.

The carrier 200 may, for example, be configured as a ceramic carrier or as a metal carrier. For example, the carrier 200 may be configured as an aluminum plate. The carrier 200 may, however, for example, also be configured as a circuit board, for example, as a printed circuit board.

A multiplicity of optoelectronic semiconductor chips 300 have been arranged over the upper side 201 of the carrier 200. In the example represented, the optoelectronic semiconductor chips 300 have been arranged directly on the upper side 201 of the carrier 200. It is, however, also possible to provide further interlayers between the upper side 201 of the carrier 200 and the optoelectronic semiconductor chips 300. The optoelectronic semiconductor chips 300 may bear loosely on the upper side 201 of the carrier 200 or may be fixed on the upper side 201 of the carrier 200 by a fastening material. In the representation of FIG. 3, the optoelectronic semiconductor chips 300 have been arranged in a regular matrix arrangement over the upper side 201 of the carrier 200.

The optoelectronic semiconductor chips 300 may, for example, be configured as light-emitting diode chips (LED chips). Each optoelectronic semiconductor chip 300 comprises an upper side 301 and a lower side 302 lying opposite the upper side 301. The optoelectronic semiconductor chips 300 have been arranged over the upper side 201 of the carrier 200 such that the lower sides 302 of the optoelectronic semiconductor chips 300 face toward the upper side 201 of the carrier 200.

Figure 4:
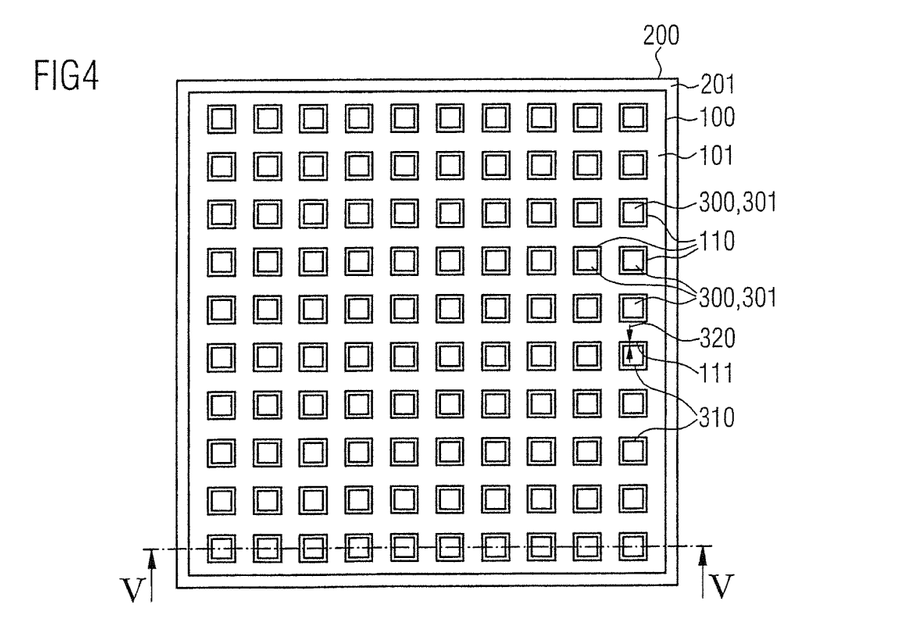
FIG. 4 schematically shows a view of the carrier, after the mat has been arranged over the upper side of the carrier such that an optoelectronic semiconductor chip is respectively arranged in each opening of the mat.

FIG. 4 shows a schematic representation of a plan view of the carrier 200, the optoelectronic semiconductor chips 300 and the mat 100 in a processing state chronologically following the representations of FIGS. 2 and 3.

Figure 5:
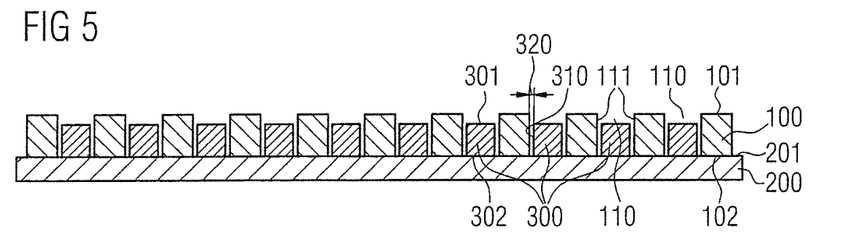
FIG. 5 schematically shows a sectional side view of the carrier, the mat and the optoelectronic semiconductor chips.

The mat 100 has been arranged over the upper side 201 of the carrier 200 such that the lower side 102 of the mat 100 faces toward the upper side 201 of the carrier 200. In this example, the mat 100 has been arranged such that the optoelectronic semiconductor chips 300 already arranged beforehand over the upper side 201 of the carrier 200 are now arranged in the openings 110 of the mat 100. An optoelectronic semiconductor chip 300 is arranged in each opening 110 of the mat 100. FIG. 5 shows a schematic sectional side view of the carrier 200, the optoelectronic semiconductor chips 300 arranged over the upper side 201 of the carrier 200 and the mat 100 arranged over the upper side 201 of the carrier 200, in the processing state shown in FIG. 4.

During the arrangement of the mat 100 over the upper side 201 of the carrier 200, the positions of the optoelectronic semiconductor chips 300 already arranged beforehand over the upper side 201 of the carrier 200 have preferably not changed. This assumes that the distances between the optoelectronic semiconductor chips 300 arranged beforehand over the upper side 201 of the carrier 200 and the distances between the openings 110 formed beforehand in the mat 100 were matched to one another.

The cross-sectional areas of the openings 110 in the mat 100 are somewhat larger than the areas of the upper sides 301 and of the lower sides 302 of the optoelectronic semiconductor chips 300. The openings 110 in the mat 100 are thus dimensioned such that, for each optoelectronic semiconductor chip 300 arranged in one of the openings 110 of the mat 100, a circumferential gap 310 respectively remains between the optoelectronic semiconductor chip 300 and an edge 111 of the respective opening 110. This circumferential gap 310 respectively has a width 320 which may, for example, be 50 μm to 400 μm, in particular, for example, 100 μm to 200 μm.

In the example shown in FIGS. 4 and 5, a thickness of the mat 100, measured between the upper side 101 and the lower side 102 of the mat 100, is greater than a thickness of the optoelectronic semiconductor chips 300, measured respectively between the upper side 301 and the lower side 302 of each optoelectronic semiconductor chip 300. The effect of this is that the upper side 101, facing away from the carrier 200, of the mat 100 arranged over the upper side 201 of the carrier 300 is raised above the upper sides 301 of the optoelectronic semiconductor chips 300 arranged over the upper side 201 of the carrier 200.

Figure 6:
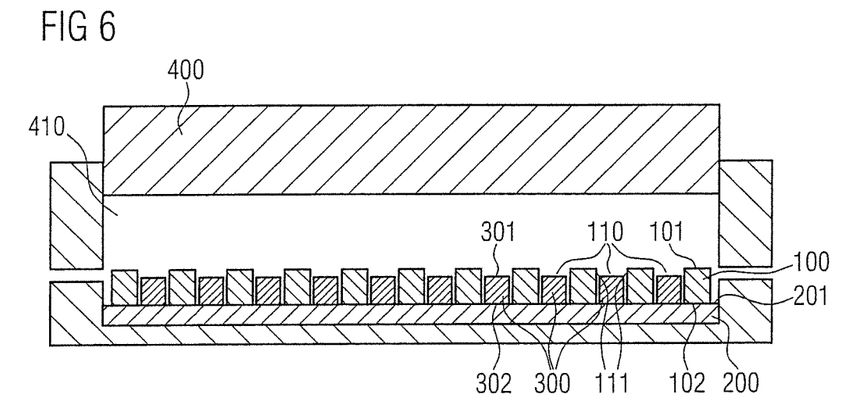
FIG. 6 schematically shows a sectional side view of the carrier, the mat and the optoelectronic semiconductor chips after arrangement in a chamber of a compacting apparatus.

FIG. 6 shows a schematic sectional side view of the carrier 200, the mat 100 and the optoelectronic semiconductor chips 300, in a processing state chronologically following the representations of FIGS. 4 and 5.

The carrier 200, the mat 100 arranged over the upper side 201 of the carrier 200 and the optoelectronic semiconductor chips 300 arranged over the upper side 201 of the carrier 200 have been arranged in a chamber 410 of a compacting apparatus 400. The compacting apparatus 400 is provided to compact the mat 100. The compacting apparatus 400 may, for example, be configured as an autoclave or a compression molding apparatus. The compacting apparatus 400 may also be configured to compact the mat 100 by a vacuum bag method.

Figure 7:
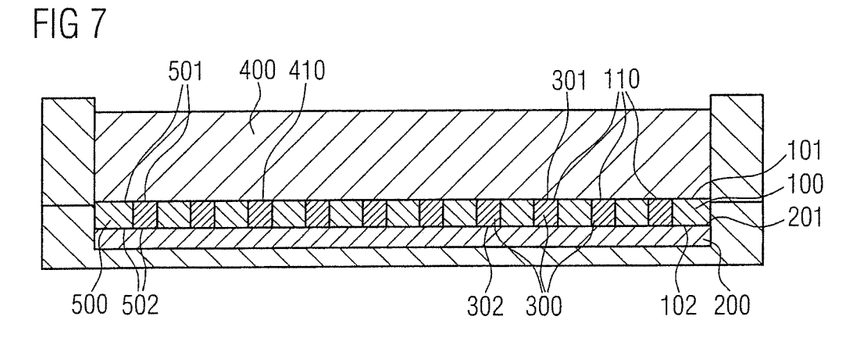
FIG. 7 schematically shows a sectional side view of the compacting apparatus during compacting of the mat.

FIG. 7 shows a schematic sectional lateral view of the carrier 200, with the mat 100 and the optoelectronic semiconductor chips 300, arranged in the chamber 410 of the compacting apparatus 400, in a processing state chronologically following the representation of FIG. 6, during compacting of the mat 100.

Pressure is exerted on the arrangement consisting of the carrier 200, mat 100 and optoelectronic semiconductor chips 300, in a direction perpendicular to the upper side 201 of the carrier 200 to compact the mat 100. This may be carried out with a pressure of, for example, 5 bar to 10 bar. In addition, heat may be applied to the arrangement consisting of the carrier 200, mat 100 and optoelectronic semiconductor chips 300 during compacting of the mat 100.

By compacting the mat 100, the fiber-matrix semifinished product of the mat 100 is compressed and cures. In this example, the optoelectronic semiconductor chips 300 arranged in the openings 110 of the mat 100 are enclosed by the material of the mat 100. In this way, a composite body 500 comprising the mat 100 and the optoelectronic semiconductor chips 300 is formed.

The thermal expansion coefficients of the mat 100 and the carrier 200 are matched to one another such that excessive stresses do not occur between the carrier 200 and the mat 100, or the composite body 500 formed from the mat 100 and the optoelectronic semiconductor chips 300, during compacting of the mat 100 and the associated temperature changes of the mat 100 and the carrier 200. It is expedient for the thermal expansion coefficient of the mat 100, or the composite body 500 formed from the mat 100 and the optoelectronic semiconductor chips 300, and the thermal expansion coefficient of the carrier 200 to differ from one another as little as possible. For example, the carrier 200 may have a first thermal expansion coefficient. The material of the mat may have a second thermal expansion coefficient after compacting the mat 100. It is expedient for the first thermal expansion coefficient and the second thermal expansion coefficient to differ by no more than 20%. It is particularly expedient for the first thermal expansion coefficient and the second thermal expansion coefficient to differ by no more than 10%.

The material of the mat 100 formed as a fiber-matrix semifinished product may be selected such that the thermal expansion coefficient of the mat 100 has a desired value. Adjustable parameters are in this example the type of the fibers of the mat 100, the arrangement of the fibers in the mat 100, the material of the polymer matrix of the mat 100 and the fiber volume content of the mat 100. The fiber volume content of the mat 100 may, after the compacting of the mat 100, for example, be 30% to 70%, in particular, for example, 40% to 60%, in particular, for example, 45% to 55%.

In a first example, the mat 100 may comprise glass fibers comprising E-glass present as a quasi-isotropic fabric in the mat 100. These fibers may respectively have a thermal expansion coefficient of 5 ppm/K in the fiber direction and transversely to the fiber direction. These fibers may be present in the mat 100 in a polymer matrix comprising an epoxy resin having a thermal expansion coefficient of 50 ppm/K. The fiber volume content of the mat 100 may be, for example, 45%. In this example, the mat 100 may have a resulting thermal expansion coefficient of 10 ppm/K, which is isotropic.

In another example, the mat 100 may comprise glass fibers comprising E-glass, which respectively have a thermal expansion coefficient of 5 ppm/K in the fiber direction and transversely to the fiber direction. The fibers may in this example be present in the mat 100 as a unidirectional fabric and embedded in an epoxy resin matrix having a thermal expansion coefficient of 60 ppm/K. The fiber volume content may in this example be 55%. In this example, the mat 100 may have a resulting thermal expansion coefficient of 7 ppm/K in the fiber direction and 21 ppm/K transversely to the fiber direction.

In a third example, the mat 100 may comprise aramid fibers having a thermal expansion coefficient of −3.5 ppm/K in the fiber direction and 17 ppm/K transversely to the fiber direction. The fibers may in this example be present in the mat 100 as a unidirectional fabric and embedded in an epoxy resin matrix having a thermal expansion coefficient of 60 ppm/K. The fiber volume content may in this example be 54%. In this example, the mat 100 may have a resulting thermal expansion coefficient of −2.9 ppm/K in the fiber direction and 56 ppm/K transversely to the fiber direction.

Figure 8:
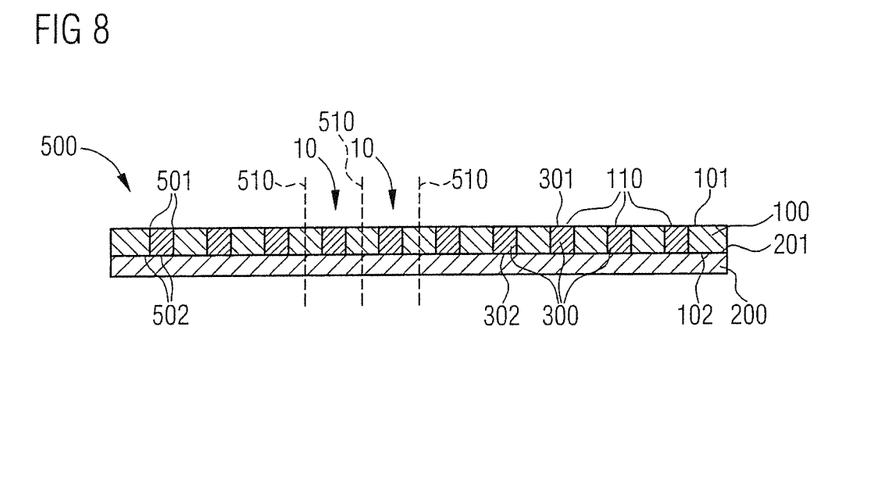
FIG. 8 schematically shows a sectional side view of the carrier and of a composite body, formed from the mat and the optoelectronic semiconductor chips by compacting the mat.
Figure 9:
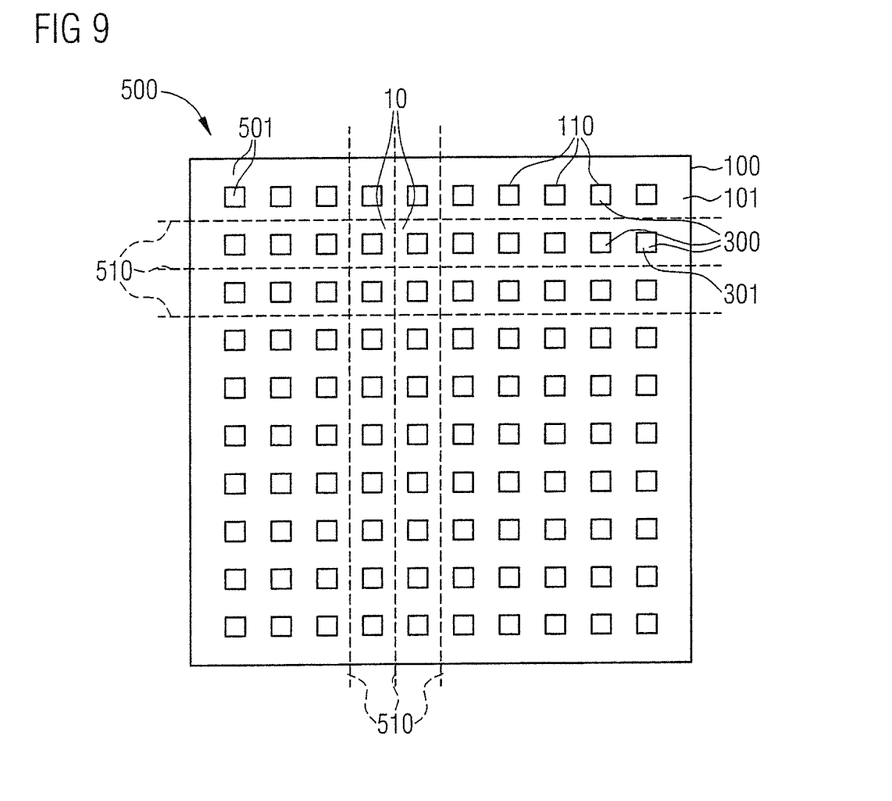
FIG. 9 schematically shows a plan view of an upper side of the composite body.

FIG. 8 shows a schematic sectional side view of the carrier 200 and the composite body 500 formed by compacting the mat 100, in a processing state chronologically following the representation of FIG. 7 after the removal of the carrier 200 and the composite body 500 from the chamber 410 of the compacting apparatus 400. FIG. 9 shows a schematic representation of a plan view of an upper side 501 of the composite body 500 in the processing state shown in FIG. 8.

The upper side 501 of the composite body 500 formed by compacting the mat 100 is configured to be essentially planar. On the upper side 501 of the composite body 500, the upper side 101 of the compacted mat 100 and the upper sides 301 of the optoelectronic semiconductor chips 300 are essentially flush. The thickness of the mat 100, measured between the upper side 101 and the lower side 102 of the mat 100, has thus been reduced by compacting the mat 100 such that the thickness of the mat 100 now corresponds approximately to the thickness of the optoelectronic semiconductor chips 300.

In the representation of FIG. 8, the composite body 500 is still arranged over the upper side 201 of the carrier 200. A lower side 502, formed by the lower side 102 of the mat 100 and the lower sides 302 of the optoelectronic semiconductor chips 300, of the composite body 500 faces toward the upper side 201 of the carrier 200. In a subsequent processing step, the composite body 500 may be separated from the carrier 200. The carrier 200 may then optionally be reused to carry out the described method again.

Subsequently, the composite body 500 may be divided along separating planes 510. The separating planes 510 in this example extend through the material of the mat 100 between the optoelectronic semiconductor chips 300. Division of the composite body 500 may, for example, be carried out by a sawing method. The parts of the composite body 500 formed by the division of the composite body 500, and respectively comprise at least one optoelectronic semiconductor chip 300, respectively form an optoelectronic component 10.

The composite body 500 need not be separated from the carrier 200. In this example, the carrier 200 may be understood as part of the composite body 500 formed during compacting of the mat 100. The carrier 200 is in this example divided together with the other parts of the composite body 500. Each optoelectronic component 10 formed in this example then comprises a part of the carrier 200. The carrier 200 may, for example, be configured as a circuit board.

Our methods have been illustrated and described in more detail with the aid of preferred examples. This disclosure is not, however, restricted to the examples disclosed. Rather, other variants may be derived therefrom by those skilled in the art without departing from the protective scope of the appended claims.

This application claims priority of DE 10 2016 115 629.9, the subject matter of which is incorporated herein by reference.

The invention claimed is:

1. A method of producing an optoelectronic component comprising:
   providing a carrier having an upper side;
   providing a mat configured as a fiber-matrix semifinished product and having a through-opening;
   arranging an optoelectronic semiconductor chip over the upper side of the carrier;
   arranging the mat over the upper side of the carrier such that 1) an upper side, facing away from the carrier of the mat is raised above an upper side, facing away from the carrier, of the optoelectronic semiconductor chip, and 2) the optoelectronic semiconductor chip is arranged in the opening of the mat; and
   compacting the mat to form a composite body comprising the mat and the optoelectronic semiconductor chip such that the upper side of the mat and the upper side of the optoelectronic semiconductor chip are flush after compacting the mat.

2. The method according to claim 1, further comprising: separating the composite body from the carrier.

3. The method according to claim 1, further comprising dividing the composite body,
   wherein the mat is provided having a multiplicity of through-openings,
   a multiplicity of optoelectronic semiconductor chips are arranged over the upper side of the carrier, and
   the mat is arranged over the upper side of the carrier such that an optoelectronic semiconductor chip is respectively arranged in each opening of the mat.

4. The method according to claim 1, wherein the opening of the mat is dimensioned such that, after the mat has been arranged over the upper side of the carrier, a circumferential gap remains between the optoelectronic semiconductor chip and the edge of the opening, which gap has a width of 50 μm to 400 μm.

5. The method according to claim 1, wherein compacting the mat is carried out by a vacuum bag method in an autoclave or by compression molding.

6. The method according to claim 1, wherein the mat comprises fibers present as a quasi-isotropic fabric.

7. The method according to claim 1, wherein the mat comprises fibers present as a unidirectional fabric.

8. The method according to claim 1, wherein the mat comprises glass fibers or E-glass.

9. The method according to claim 1, wherein the mat comprises aramid fibers.

10. The method according to claim 1, wherein the mat has after the compacting a fiber volume content of 30% to 70%.

11. The method according to claim 1, wherein the mat comprises an epoxy resin.

12. The method according to claim 1, wherein providing the mat comprises formation of the opening by a stamping method, a cutting method or a laser cutting method.

13. The method according to claim 1, wherein the carrier is provided as a circuit board, a ceramic carrier or a metal carrier.

14. The method according to claim 1,
   wherein the carrier has a first thermal expansion coefficient,
   the material of the mat has a second thermal expansion coefficient after the compacting, and
   the first thermal expansion coefficient and the second thermal expansion coefficient differ by no more than 20%.

* * * * *